(12) United States Patent
Choi

(10) Patent No.: US 7,391,243 B2
(45) Date of Patent: Jun. 24, 2008

(54) LOW POWER AND LOW TIMING JITTER PHASE-LOCK LOOP AND METHOD

(75) Inventor: Dong Myung Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/788,133

(22) Filed: Apr. 18, 2007

(65) Prior Publication Data

US 2007/0222490 A1 Sep. 27, 2007

Related U.S. Application Data

(60) Division of application No. 11/394,506, filed on Mar. 31, 2006, now Pat. No. 7,276,945, which is a continuation of application No. 10/868,284, filed on Jun. 14, 2004, now Pat. No. 7,042,260.

(51) Int. Cl.
 *H03L 7/06* (2006.01)
(52) U.S. Cl. .................................... 327/156; 327/158
(58) Field of Classification Search ................ 327/116, 327/119–122, 144–163, 2–12; 375/211–215, 375/373–376; 331/DIG. 2, 1 A, 10, 16–18, 331/25
See application file for complete search history.

(56) References Cited

U.S. PATENT DOCUMENTS

| | | | |
|---|---|---|---|
| 4,516,083 A | 5/1985 | Turney | 331/1 A |
| 4,668,923 A | 5/1987 | Lofter | 331/16 |
| 4,766,397 A | 8/1988 | Adams | 331/1 A |
| 5,337,023 A | 8/1994 | Hobrecht | 331/20 |
| 5,630,222 A | 5/1997 | Barrett, Jr. et al. | 455/260 |
| 5,712,883 A | 1/1998 | Miller et al. | 375/371 |
| 5,945,881 A | 8/1999 | Lakshmikumar | 331/16 |
| 6,014,048 A | 1/2000 | Talaga, Jr. et al. | 327/156 |
| 6,049,238 A | 4/2000 | Shimizu et al. | 327/156 |
| 6,317,161 B1 | 11/2001 | Renner et al. | 348/536 |
| 6,424,192 B1 | 7/2002 | Lee et al. | 327/156 |
| 6,441,655 B1 | 8/2002 | Fallahi et al. | 327/115 |
| 6,445,229 B1 | 9/2002 | Schenck et al. | 327/116 |
| 6,480,047 B2 | 11/2002 | Abdel-Maguid et al. | 327/161 |
| 6,538,518 B1 | 3/2003 | Chengson | 331/17 |
| 6,646,477 B1 | 11/2003 | Xin-LeBlanc | 327/3 |
| 6,744,323 B1 | 6/2004 | Moyal et al. | 331/1 A |
| 6,756,828 B2 | 6/2004 | Lee et al. | 327/156 |
| 6,768,358 B2 | 7/2004 | Birk et al. | 327/156 |
| 6,885,253 B2 * | 4/2005 | Ahmed | 331/45 |
| 2003/0042951 A1 | 3/2003 | Gomm | 327/158 |
| 2003/0090296 A1 * | 5/2003 | Yoo | 327/12 |

* cited by examiner

*Primary Examiner*—Tuan T. Lam
*Assistant Examiner*—Diana J Cheng
(74) *Attorney, Agent, or Firm*—Dorsey & Whitney LLP

(57) ABSTRACT

A phase-lock loop generates an output clock signal from an input clock signal. The output clock signal is coupled through a clock tree and is fed back to a phase detector, which compares the phase of the output clock signal to the phase of the input clock signal. The output clock signal is generated by a voltage controlled oscillator having a control input coupled to receive an output from the phase detector, and a frequency multiplier coupled to the output of the voltage controlled oscillator. As a result, the $CLK_{OUT}$ signal generated by the frequency multiplier has a relatively high frequency while the voltage controlled oscillator, by operating at a relatively low frequency, uses relatively little power.

17 Claims, 12 Drawing Sheets

LOW POWER AND LOW TIMING JITTER PHASE-LOCK LOOP AND METHOD

CROSS-REFERENCE TO RELATED APPLICATIONS

This application is a divisional of pending U.S. patent application Ser. No. 11/394,506, filed Mar. 31, 2006 now U.S. Pat. No. 7,276,945, which is a continuation of U.S. patent application Ser. No. 10/868,284, filed Jun. 14, 2004, U.S. Pat. No. 7,042,260.

TECHNICAL FIELD

This invention relates to phase-lock loops for generating one or more clock signals from an input clock signal.

BACKGROUND OF THE INVENTION

Periodic digital signals are commonly used in a variety of electronic devices. Probably the most common of periodic digital signals are clock signals that are typically used to establish the timing of a digital signal or the timing at which an operation is performed on a digital signal. For example, data signals are typically coupled to and from memory devices, such as synchronous dynamic random access memory ("SDRAM") devices, in synchronism with a clock or data strobe signal.

As the speed of memory devices and other devices continue to increase, the "eye" or period in which a digital signal, such as a data signal, is valid becomes smaller and smaller, thus making the timing of a strobe signal or other clock signal used to capture the digital signal even more critical. In particular, as the size of the eye becomes smaller, the propagation delay of the strobe signal can be different from the propagation delay of the captured digital signal(s). As a result, the skew of the strobe signal relative to the digital signal can increase to the point where a transition of the strobe signal is no longer within the eye of the captured signal.

One technique that has been used to ensure the correct timing of a strobe signal relative to captured digital signals is to use a phase-lock loop ("PLL") to generate the strobe signal. In particular, a phase-lock loop allows the timing of the strobe signal to be adjusted to minimize the phase error between the strobe signal and the valid eye of the digital signal. For example, as shown in FIG. 1, a conventional phase-lock loop 10 receives an input clock signal $CLK_{IN}$ and generates an output clock signal $CLK_{OUT}$ from the $CLK_{IN}$ signal. The phase-lock loop 10 includes a phase detector 12 that receives the input clock $CLK_{IN}$ signal and compares the phase of the $CLK_{IN}$ signal to the output clock signal $CLK_{OUT}$. The phase detector 12 generates an error signal $V_E$ that is indicative of the phase error between the $CLK_{IN}$ signal and the $CLK_{OUT}$ signal. This error signal $V_E$ is applied to a loop amplifier 14, which normally has a relatively high gain. The loop amplifier 14 generates an amplified error signal $V_{E+}$.

Although the $V_E$ signal has a relatively low frequency component indicative of the phase error between the $CLK_{IN}$ and $CLK_{OUT}$ signals, it also normally includes harmonics of the $CLK_{IN}$ and $CLK_{OUT}$ signals. As explained below, these harmonics would cause the phase of the $CLK_{OUT}$ signal to periodically vary at a high frequency, which is a trait known as "phase noise." To minimize the phase noise, the amplified $V_E$ signal is applied to a loop filter 16, which is normally a low-pass filter having a cutoff frequency that is well below the frequency of the $CLK_{IN}$ signal. The loop filter 16 therefore generates a relatively low frequency control signal $V_{CON}$ that is applied to a voltage controlled oscillator ("VCO") 20. A single component, such as an operational amplifier (not shown), is often used for both the loop filter 16 and the loop amplifier 14. The VCO 20 generates the $CLK_{OUT}$ signal with a frequency that is proportional to the magnitude of the $V_{CON}$ signal.

In operation, the closed-loop nature of the phase-lock loop 10 causes the phase of the $CLK_{OUT}$ signal from the VCO 20 to be adjusted so that the phase of the $CLK_{OUT}$ signal differs from the phase of the $CLK_{IN}$ by a phase error that causes the $V_{CON}$ signal to have a magnitude that maintains the frequency of the $CLK_{OUT}$ signal equal to the frequency of the $CLK_{IN}$ signal. In general terms, a small phase error can be maintained by using a loop amplifier 14 having a larger gain since a given phase error will produce a larger control voltage $V_{CON}$.

Another conventional phase-lock loop 30 is shown in FIG. 2. The phase-lock loop 30 is substantially identical in structure and operation to the phase-lock loop 10 of FIG. 1. Therefore, in the interest of brevity, identical components have been provided with the same reference numerals, and an explanation of their function and operation will not be repeated. The phase-lock loop 30 differs from the phase-lock loop 10 by including a frequency divider 34 in the signal path from the VCO 20 to the phase detector 12. The frequency divider 34 is programmable to reduce the frequency of the $CLK_{OUT}$ signal by dividing it by any integer value N. Therefore, if the $CLK_{OUT}$ signal has a frequency of $F_0$, the signal fed back to the phase detector 12 will have a frequency of $F_0/N$.

In operation, the closed loop nature of the phase-lock loop 30 will cause the $V_{CON}$ signal to have a value that ensures that the frequency of the signals applied to the phase detector 12 are equal to each other. Thus, if the $CLK_{IN}$ signal has a frequency of $F_{IN}$, the frequency $F_0/N$ of the signal fed back to the phase detector 12 will also be $F_{IN}$, i.e., $F_0/N=F_{IN}$. Solving this equation for $F_0$, it can be seen that $F_0=N*F_{IN}$, i.e., the $CLK_{OUT}$ signal will have a frequency that is an integer multiple of the frequency of the $CLK_{IN}$ signal.

Although phase-lock loops have been successful in allowing digital signals to be captured in a digital device operating at a high speed, they are not without their disadvantages. In particular, phase-lock loops can consume a great deal of power, which can be a significant disadvantage in certain applications, such as in battery powered devices like laptop computers. The magnitude of the power consumed by phase-lock loops is a function of several parameters. In general, the power consumed by a phase-lock loop is directly proportional to the frequency of the signal generated by the loop since power is consumed each time a transistor is switched between two logic levels. Unfortunately, a high operating frequency is needed to match the high operating speed of digital devices, thus making it impractical to minimize power consumption. Also, a high operating frequency has the advantage of reducing the time required for the phase-lock loop to achieve a locked condition.

Phase-lock loops can also exhibit problem other than those related to power consumption. A clock signal produced by a phase-lock loop can have an unacceptable amount of phase noise, particularly if the loop amplifier 14 has a high gain, which, as explained above, is desirable to provide good phase control. While phase noise can be reduced by reducing the frequency response of the loop filter 16, doing so can reduce the ability of the loop to respond to variations in the frequency of the $CLK_{IN}$ signal and may unduly increase the time required for the loop to achieve lock.

The effect of phase noise and other noise sources can be explained with reference to the phase-lock loop shown in FIG. 3, which is the phase-lock loop 30 of FIG. 2 to which noise sources $\theta_{N1}$, $\theta_{N2}$, and $\theta_{N3}$ have been added. Also shown in FIG. 3 are the gain of the phase detector 12 as $K_\Phi$, the transfer function of the loop amplifier 14 as $Z_F(S)$, and the transfer function of the VCO 20 as $K_{VCO}/S$. The noise source $\theta_{N1}$ is the phase noise in the $CLK_{IN}$ signal, which can result, for example, from variations in power supply voltage. The noise source $\theta_{N2}$ is electrical noise in the loop filter 16, which can result, for example, from cross coupling of signals in the loop filter 16. The noise source $\theta_{N3}$ is phase noise in the voltage controlled oscillator 20. The open loop gain G(S) of the phase-lock loop 30 is given by the formula $G(S)=K_\Phi Z_F(S)K_{VCO}/S$, and the transfer function between all of these noise sources and the output signal $CLK_{OUT}$, can be expressed by the following formulae:

$$H_{N1}(S)=NG(S)/(1+G(S)) \quad \text{(Graph 1)}$$

$$H_{N2}(S)=K_{VCO}/S(1+G(S)) \quad \text{(Graph 2)}$$

$$H_{N3}(S)=1/(1+G(S)) \quad \text{(Graph 3)}$$

Graphs for these formulae are shown in FIG. 4. As explained below, similar graphs for an embodiment of the invention can be favorably compared to these graphs.

There is therefore a need for a phase-lock loop that can operate at a high frequency and yet consume relatively little power, and can operate over a wide frequency range and relatively quickly achieve a locked condition.

SUMMARY OF THE INVENTION

A phase-lock loop and method is used to generate an output clock signal responsive to an input clock signal. The phase-lock loop includes a phase detector that generates a phase error signal indicative of a relationship between the phase of the input clock signal and the phase of the output clock signal. The phase-lock loop also includes a voltage controlled oscillator that generates a clock signal having a frequency corresponding the phase error signal. However, the clock signal from the voltage controlled oscillator is not used as the output clock signal. Instead, the clock signal from the voltage controlled oscillator is coupled to a frequency multiplier that generates the output clock signal with a frequency that is a multiple, such as an integer multiple, of the frequency of the clock signal generated by the voltage controlled oscillator. The voltage controlled oscillator may be a ring oscillator formed by a plurality of delay elements that are coupled to each other in a ring and have a respective delay control terminal that controls the signal propagation delay through the delay element. The delay control terminal of each of the delay elements is coupled to the output of the phase detector so that the signal propagation delay of each of the delay elements corresponds to the phase error signal. Each of the delay elements generates a respective phase of the clock signal generated by the voltage controlled oscillator. If the voltage controlled oscillator generates multi-phased signals, the frequency multiplier may be a clock serializer that transitions the output clock signal between two levels responsive to each transition of any of the phases of the clock signal from the respective delay elements.

DETAILED DESCRIPTION

Figure 1:
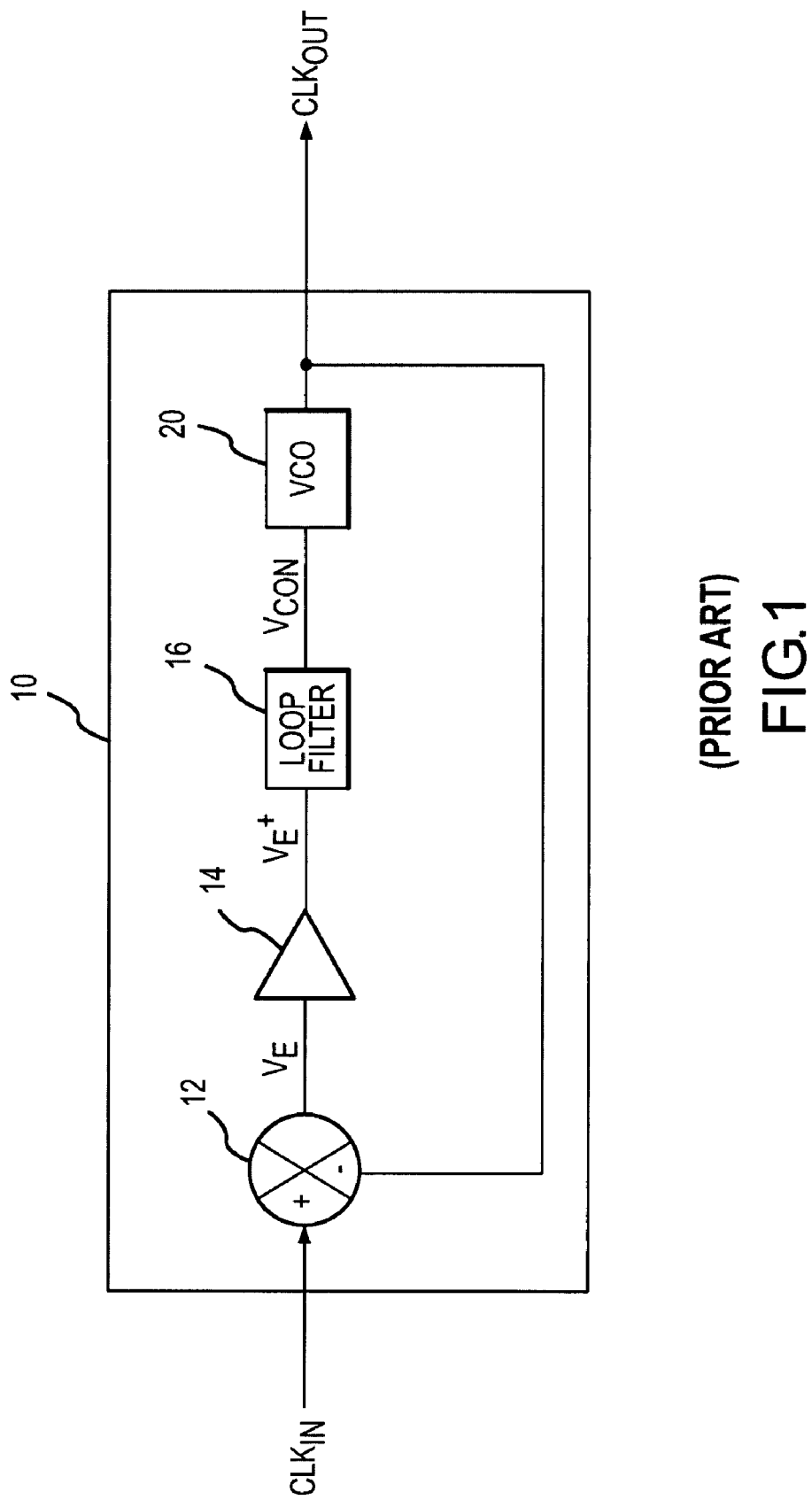
FIG. 1 is a block diagram of one type of conventional phase-lock loop circuit.
Figure 2:
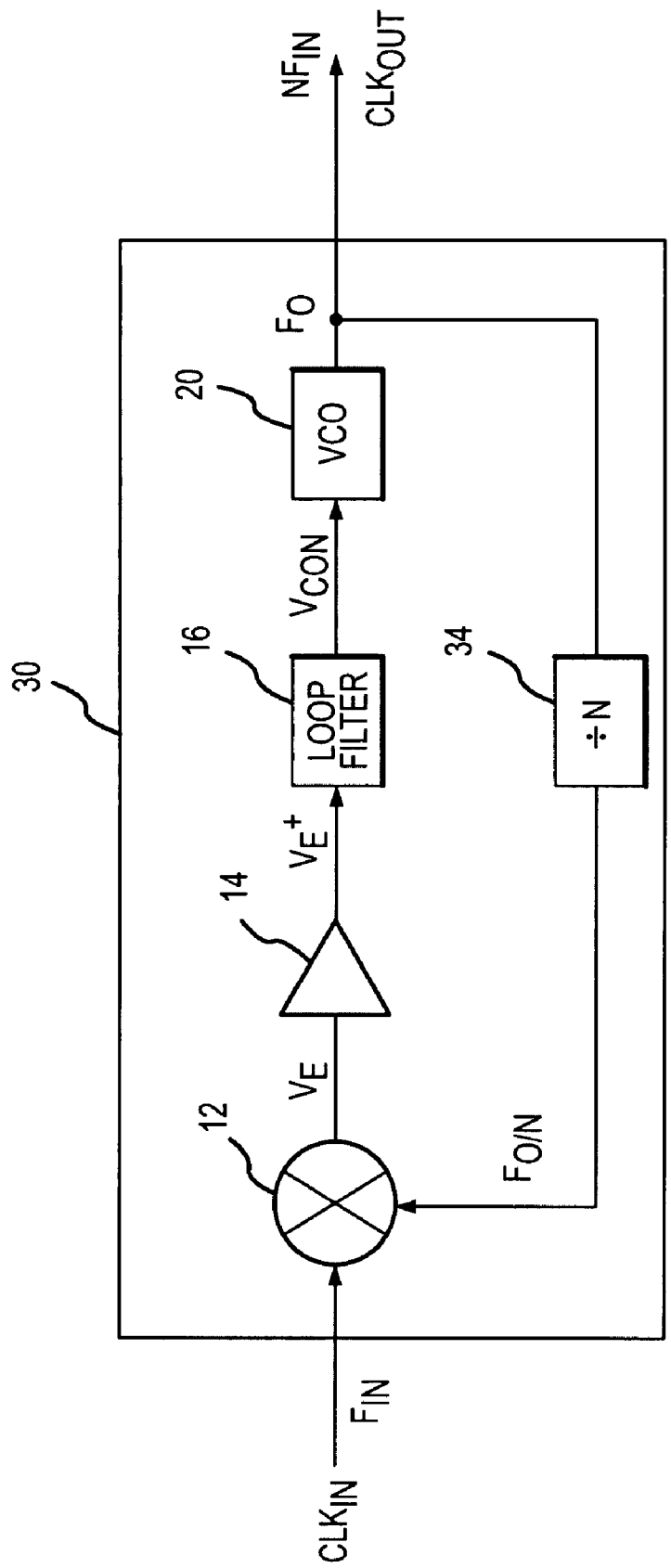
FIG. 2 is a block diagram of another type of conventional phase-lock loop circuit.
Figure 3:
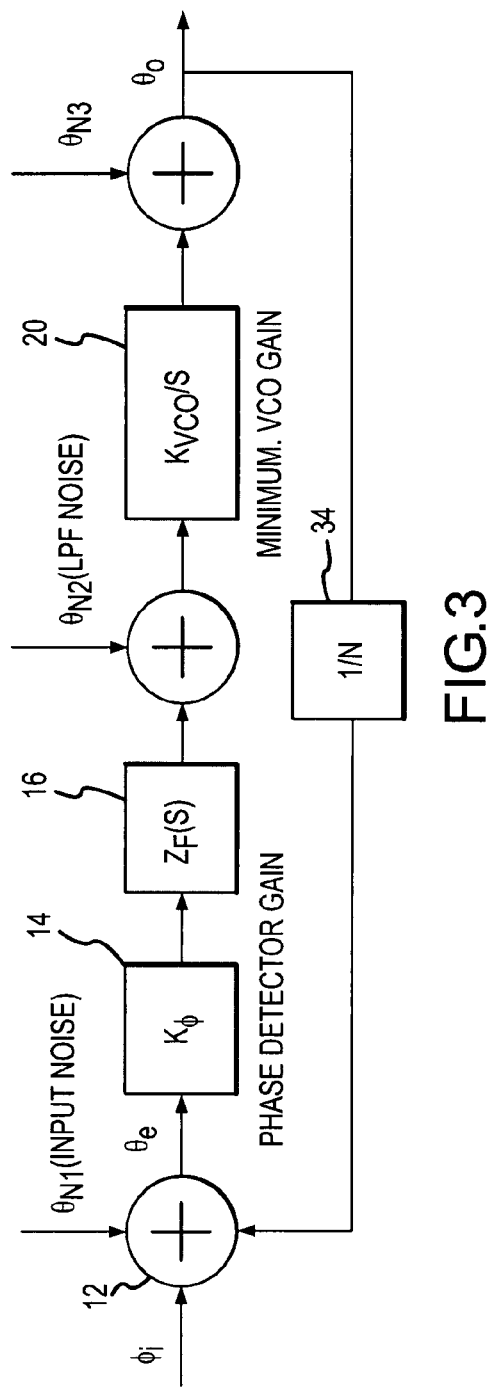
FIG. 3 is a block diagram of the phase-lock loop of FIG. 2 after being annotated to show various noise sources.
Figure 5:
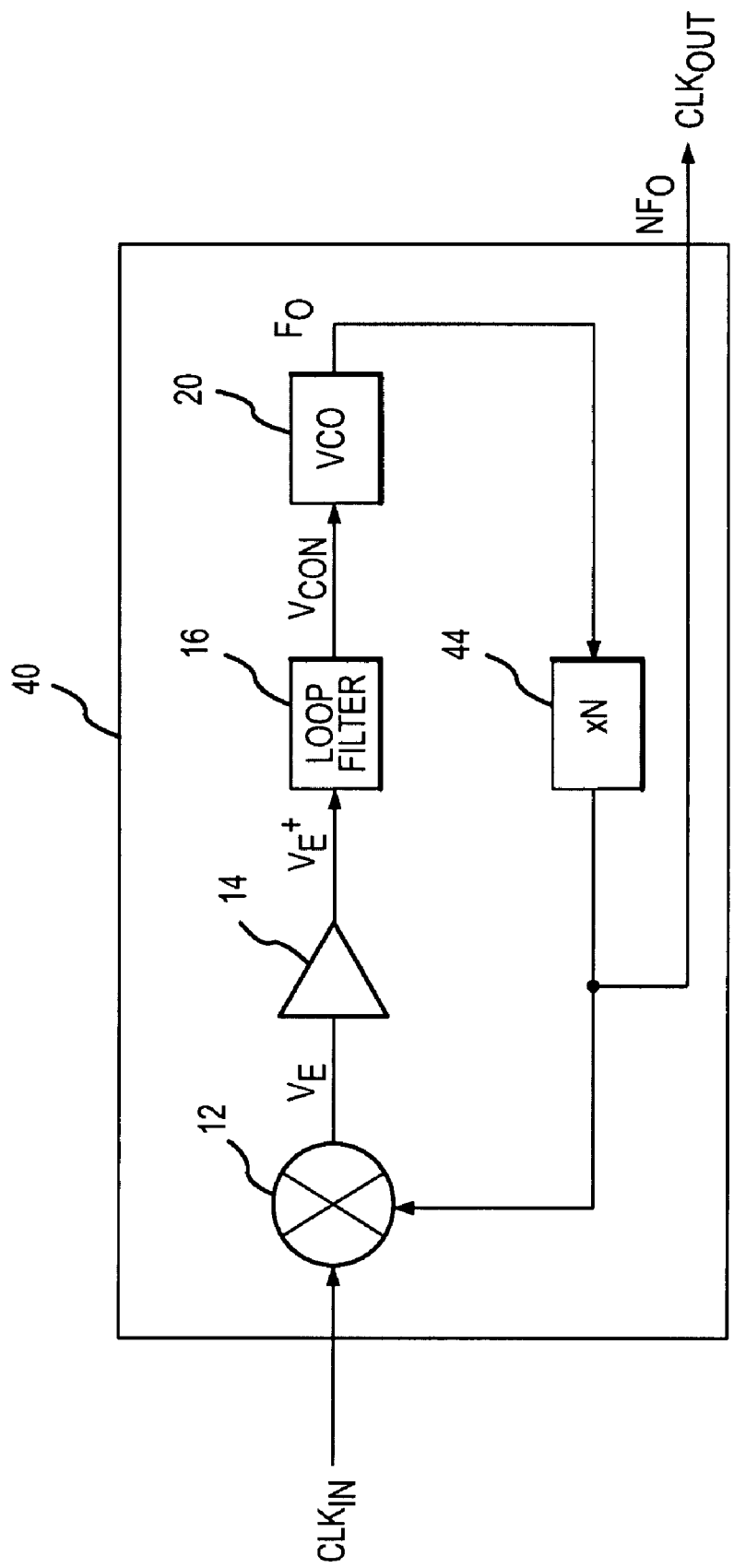
FIG. 5 is a block diagram of a phase-lock loop circuit according to one embodiment of the invention.

One embodiment of a phase-lock loop circuit 40 for generating an output clock signal $CLK_{OUT}$ from an input clock signal $CLK_{IN}$ in accordance with the present invention is shown in FIG. 5. The phase-lock loop 40 is similar in structure and operation to the phase-lock loop 10 of FIG. 1. Therefore, in the interest of brevity, identical components have been provided with the same reference numerals, and an explanation of their function and operation will not be repeated. The phase-lock loop 40 differs from the phase-lock loops 10, 30 by including a frequency multiplier 44 in the signal path from the VCO 20 to the phase detector 12. Also, the signal $V_{OUT}$ generated by the phase-lock loop 40 is taken at the output of the frequency multiplier 44 rather than at the output of the VCO 20 as in the phase-lock loop 30 of FIG. 2. The frequency multiplier 44 is programmable to multiply the frequency of the signal at the output of the VCO 20 by any integer value N. Therefore, if the signal at the output of the VCO 20 has a frequency of $F_0$, the signal $CLK_{OUT}$ fed back to the phase detector 12 will have a frequency of $N*F_0$.

In operation, the closed loop nature of the phase-lock loop 40 will cause the $V_{CON}$ signal to have a value that ensures that the frequency of the $CLK_{OUT}$ signal fed back to the phase detector 12 to have a frequency that is equal to the frequency of the $CLK_{IN}$ signal that is also applied to the phase detector 12. Thus, if the $CLK_{IN}$ signal has a frequency of $F_{IN}$, the frequency $N*F_0$ of the $CLK_{OUT}$ signal fed back to the phase detector 12 will also be $F_{IN}$, i.e., $N*F_0=F_{IN}$. Solving this equation for $F_0$, it can be seen that $F_0=F_{IN}/N$, i.e., the signal at the output of the VCO 20 will have a frequency that is the frequency of the $CLK_{IN}$ signal reduced by a factor of N, although the $CLK_{OUT}$ signal will have a frequency that is equal to the frequency of the $CLK_{IN}$ signal.

Figure 6:
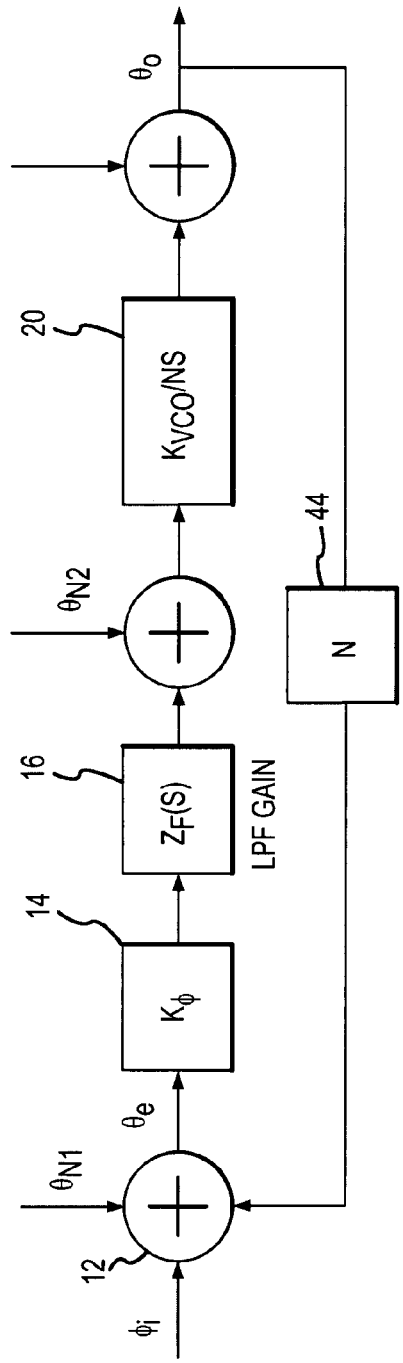
FIG. 6 is a block diagram of the phase-lock loop of FIG. 5 after being annotated to show various noise sources.

The advantage of the phase-lock loop 40 is that the operating frequency of the VCO 12 is reduced by a factor of N, while the frequency of the $CLK_{OUT}$ signal is maintained at the same high frequency as the frequency of the $CLK_{IN}$ signal. Since the phase detector 12 is still receiving the same high frequency signals, the harmonic components of the $V_E$ signal generated at its output still relatively high even though the VCO 12 is operating at a much lower frequency, thereby making it easier for the loop filter 16 to filter the high frequency components. Also, the high frequency of the $CLK_{IN}$ and $CLK_{OUT}$ signals applied to the phase detector 12 allows the phase lock loop 40 to achieve lock substantially sooner than could be achieved if the signals applied to the phase detector 12 had a frequency commensurate with the operating frequency of the VCO 20. The phase lock loop 40 also has the advantage of reducing the effect on the output signal $CLK_{OUT}$ of phase noise in the input signal $CLK_{IN}$, as shown in FIG. 6. FIG. 6 shows the phase-lock loop 40 of FIG. 5 to which the previously described noise sources $\theta_{N1}$, $\theta_{N2}$, and $\theta_{N3}$ have been added. Also, as before, the gain of the phase detector 12 is shown as $K_\Phi$, the transfer function of the loop amplifier 14 is shown as $Z_F(S)$, and the transfer function of the VCO 20 is shown as $K_{VCO}/S$. The open loop gain G(S) of the phase-lock loop 40 is again given by the formula $G(S)=K_\Phi Z_F(S) K_{VCO}/S$. The transfer function between all of these noise sources and the output signal $CLK_{OUT}$, can be expressed by the following formulae:

$$H_{N1}(S)=(G(S)/N)/(1+G(S))$$ (Graph 1)

$$H_{N2}(S)=K_{VCO}/NS(1+G(S))$$ (Graph 2)

$$H_{N3}(S)=1/(1+G(S))$$ (Graph 3)

Figure 4:
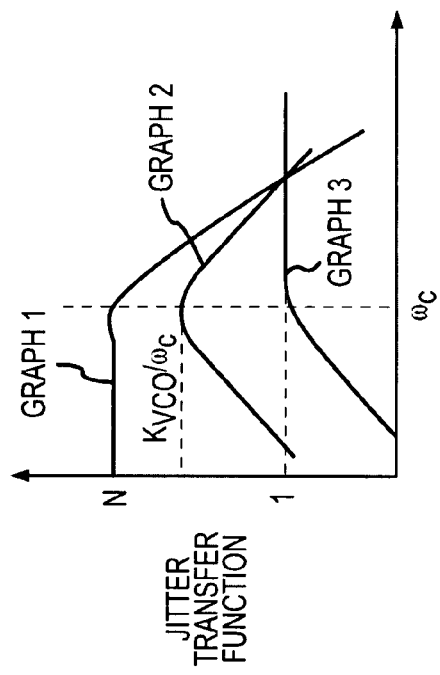
FIG. 4 is a graph showing the effect on an output signal from the phase-lock loop of FIG. 2 of the noise sources shown in FIG. 3.
Figure 7:
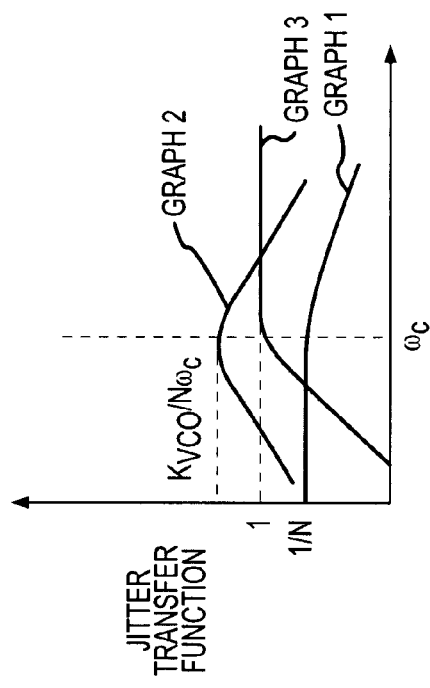
FIG. 7 is a graph showing the effect on an output signal from the phase-lock loop of FIG. 5 of the noise sources shown in FIG. 6.

Graphs for these formulae are shown in FIG. 7. As can be seen by comparing FIG. 7 to FIG. 4, the effects on the output signal $CLK_{OUT}$ of all of the noise sources except for the VCO noise are significantly reduced.

Figure 8:
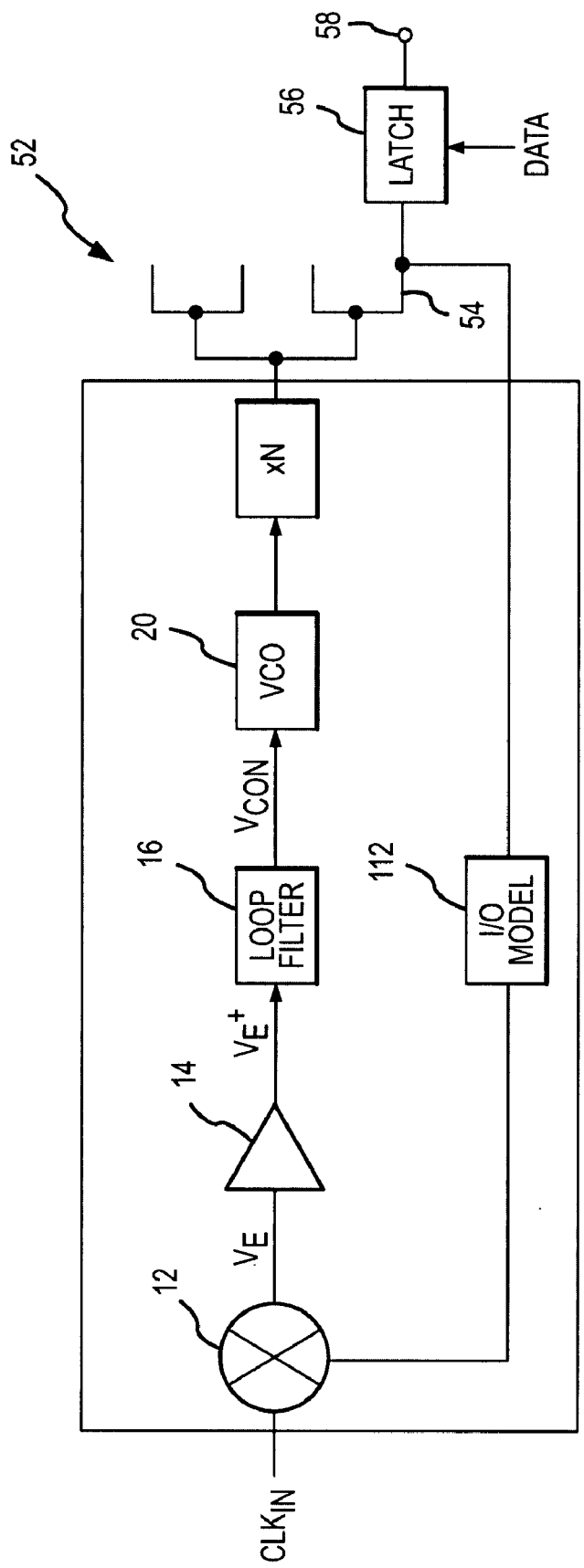
FIG. 8 is a block diagram of a phase-lock loop circuit according to another embodiment of the invention.

Although the $CLK_{OUT}$ signal is shown in FIG. 5 as being coupled to the phase detector 12 directly from the output of the frequency multiplier 44, it may alternatively be coupled to the to the phase detector 12 through a clock tree as shown in the phase lock loop 50 FIG. 8. Again, since the phase-lock loop 50 is similar in structure and operation to the phase-lock loop 40 of FIG. 5, identical components have been provided with the same reference numerals, and an explanation of their function and operation will not be repeated. The phase-lock loop 50 includes a clock tree 52 through which the $CLK_{OUT}$ signal is coupled. The clock tree 52 includes a branch 54 that is coupled to a data output latch 56 that receives a data bit DATA and applies the data bit DATA to a data bus terminal 58 responsive to transition of the $CLK_{OUT}$ signal. By coupling the $CLK_{OUT}$ signal to the phase detector 12 from the clock tree 52, the phase-lock loop 50 insures that the data bit DATA bit is coupled to the data bus terminal 58 in synchronism with the $CLK_{IN}$ signal.

Figure 9:
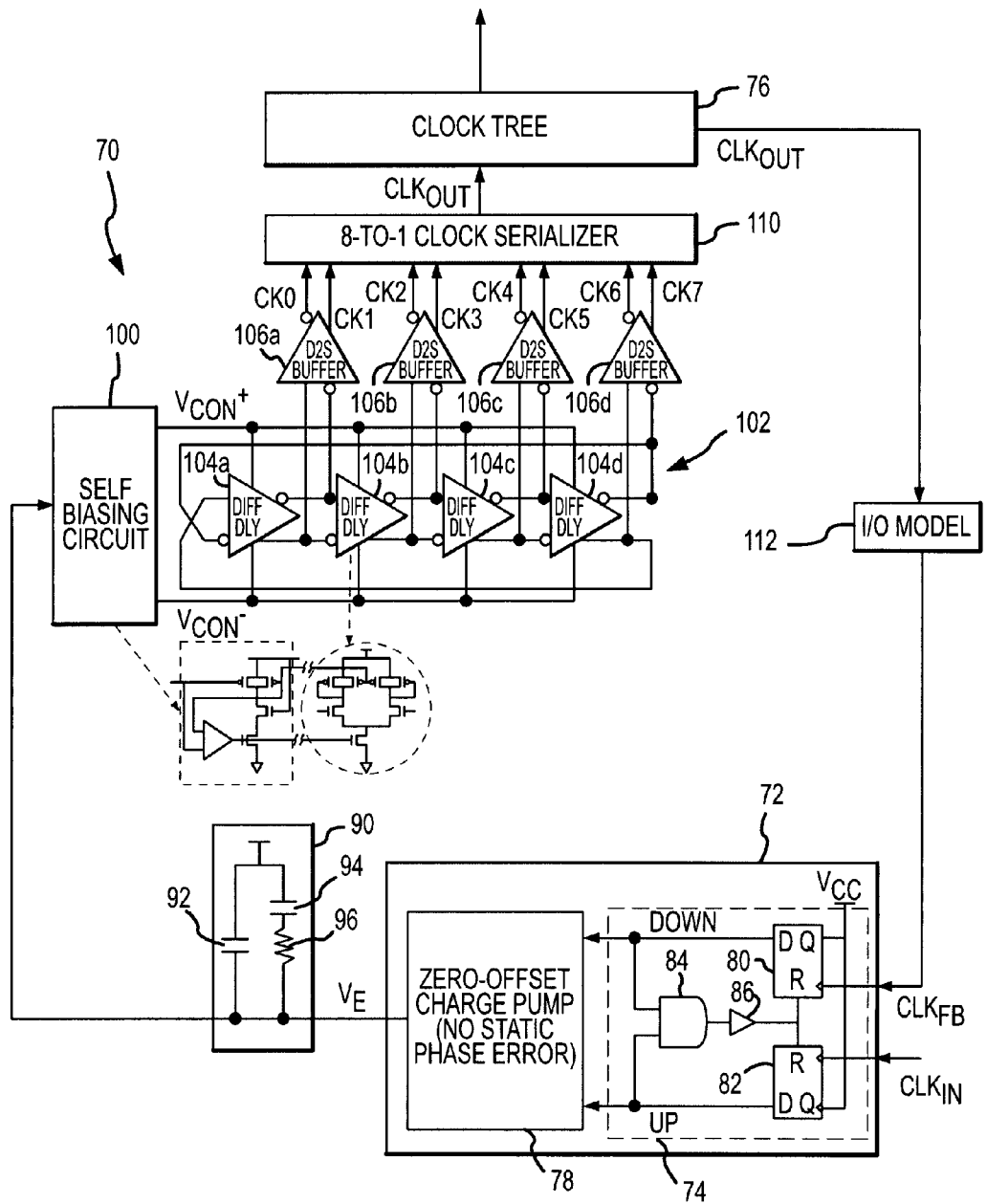
FIG. 9 is a block diagram of a phase-lock loop circuit according to another embodiment of the invention.

A phase-lock loop 70 according to one embodiment of the invention is shown in greater detail in FIG. 9. The phase-lock loop 70 includes a phase detector 72 that receives a $CLK_{IN}$ signal and a feedback clock signal $CLK_{FB}$. The phase detector 72 includes an up/down control circuit 74 that generates either a "DOWN" signal to decrease the frequency of a $CLK_{OUT}$ signal output from a clock tree 76 or an "UP" signal to increase the frequency of the $CLK_{OUT}$ signal output from a clock tree 76. The phase detector 72 also includes a charge pump 78 that receives the DOWN and UP signals. Basically, the charge pump 78 generates an error voltage $V_E$ that increases in magnitude responsive to the UP signal, and decreases in magnitude responsive to the DOWN signal.

The up/down control circuit 74 includes a first flip-flop 80 that is clocked by the $CLK_{FB}$ signal, and a second flip-flop 82 that is clocked by the $CLK_{IN}$ signal. The supply voltage $V_{CC}$ is coupled to both of the flip-flops 80, 82. Thus, the DOWN signal is generated whenever the $CLK_{FB}$ signal transitions high, and the UP signal is generated whenever the $CLK_{IN}$ signal transitions high. However, the DOWN and UP signals are applied to an AND gate 84, which couples a reset signal through a driver 86 to reset terminals of the flip-flops 80, 82. Therefore the flip-flop 80 is set to generate the DOWN signal only until the UP signal is generated, and the flip-flop 82 is set to generate the UP signal only until the DOWN signal is generated. The duration of the DOWN signal is thus substantially equal to the time that the phase of the $CLK_{FB}$ signal leads the phase of the $CLK_{IN}$ signal, and the duration of the UP signal is substantially equal to the time that the phase of the $CLK_{FB}$ signal lags the phase of the $CLK_{IN}$ signal.

The error signal $V_E$ generated by the phase detector is applied to a loop filter 90, which is formed by a low-pass filter formed by a capacitor 92 that increasingly attenuates the error signal $V_E$ as a function of frequency and a series combination of a capacitor 94 and resistor 96 that increasingly attenuates the error signal $V_E$ as a function of frequency only until the impedance of the capacitor 94 is substantially equal to the impedance of the resistor 96.

The loop filter 90 is coupled to the input of a self-biasing circuit 100 that generates a pair of control voltages $V_{CON+}$ and $V_{CON-}$ that are applied to respective control inputs of a ring oscillator 102. The ring oscillator 102 includes 4 delay stages 104a-d each of which includes a non-inverting input, an inverting input and inverting and non-inverting outputs, in addition to the + and – control inputs. The delay stages 104a-d are coupled in series with each other and from the last delay stage 104d to the first delay stage 104a with each inverting output coupled to a non-inverting input, and each non-inverting output coupled to an inverting input. Insofar as there are an even number of delay stages 104a-d, the delay stages 104a-d are unstable and therefore oscillate at a frequency that is a function by the propagation delay through each of the stages 104a-d. The propagation delay through each of the stages is controlled by the $V_{CON+}$ and $V_{CON-}$ control voltages that are applied to + and – control inputs, respectively, of the delay stages 104a-d. Therefore, the delay stages 104a-d operate at a frequency that is determined by the $V_{CON+}$ and $V_{CON-}$ control voltages.

The outputs of each of the delay stages 104a-d are coupled to a respective buffer 106a-d. The buffers 106 collectively generate four clock signals and their compliments, which are labeled CK0-CK7. These clock signals are applied to an 8:1 serializer circuit 110 that generates an output clock signal $CLK_{OUT}$ that is applied to the clock tree 76. Significantly, the $CLK_{OUT}$ signal generated by the serializer circuit 110 has a frequency that is four times the operating frequency of the ring oscillator 102. The serializer circuit 110 thus functions as the frequency multiplier 44 used in the phase-lock loops 40, 50 of FIGS. 5 and 8, respectively. The ring oscillator 102 and serializer circuit 110 therefore generate a relatively high frequency clock signal while the ring oscillator 102 consumes the relatively low power resulting from generating a relatively low frequency clock signal.

The $CLK_{OUT}$ signal generated by the serializer circuit 110 is coupled from a location in the clock tree 76 to the phase detector 72 preferably through an I/O model circuit 112. The I/O model circuit 112 is a delay circuit that compensates for any delay of the $CLK_{OUT}$ signal or a signal strobed by the $CLK_{OUT}$ signal downstream from the location where the $CLK_{OUT}$ signal is coupled from the clock tree 76. For example, if the $CLK_{OUT}$ signal is coupled from the clock tree 76 at the input to the latch 56 (FIG. 8), the I/O model circuit would compensate for the delay of the DATA bit as it is coupled from the latch 56 to the data bus terminal 58.

Figure 10:
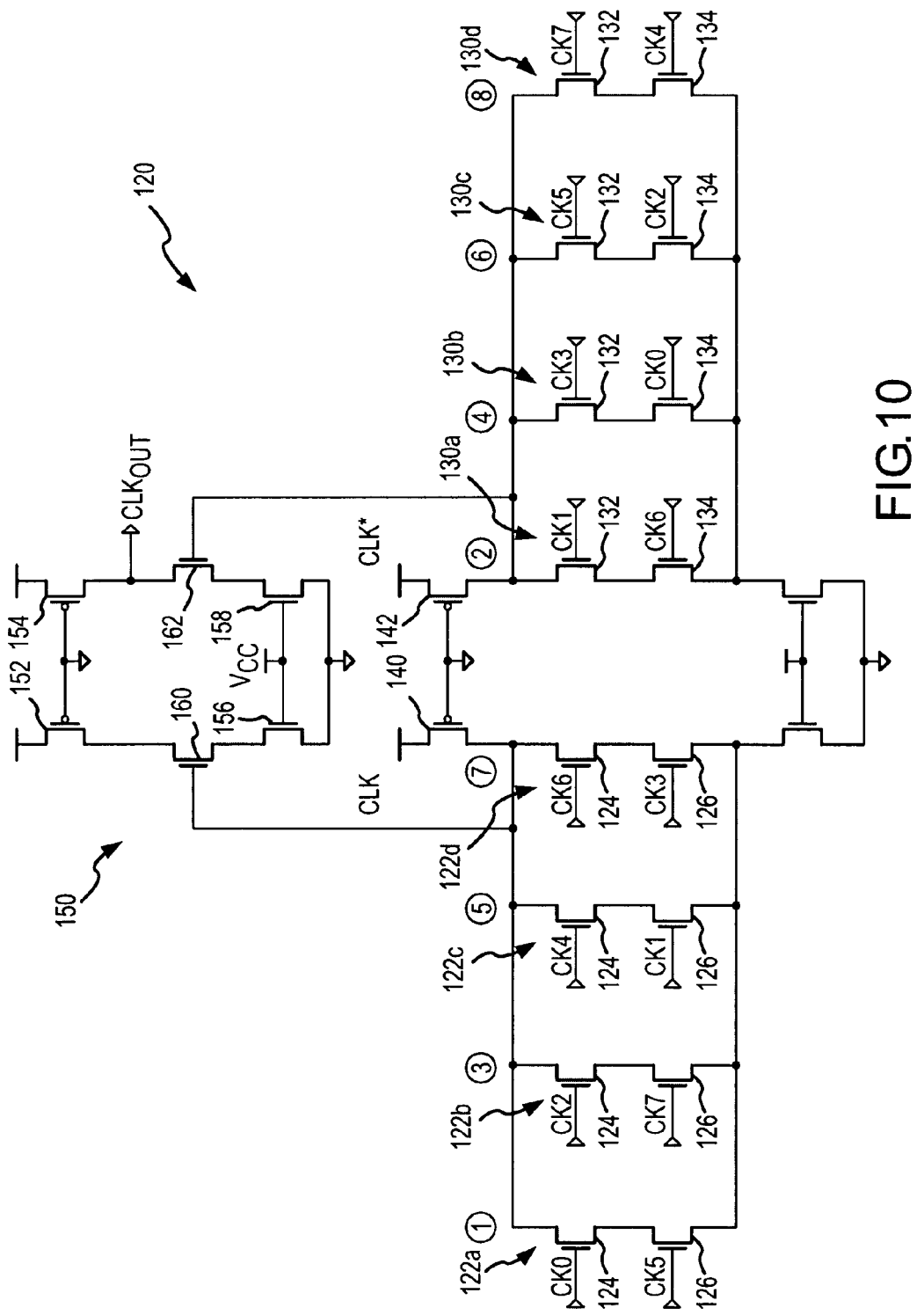
FIG. 10 is a schematic diagram of a clock serializer circuit that can be used in the phase-lock loop circuit of FIG. 9.

One embodiment of a clock serializer circuit 120 that can be used as the clock serializer circuit 110 of FIG. 9 is shown in FIG. 10. The serializer circuit includes four parallel branches 122a-d of first and second NMOS transistors 124, 126 coupled in series, which have been provided with odd-numbered designations for reasons that will become apparent later. The serializer circuit also includes four parallel branches 130a-d of first and second NMOS transistors 132, 134 coupled in series, which have been provided with even-numbered designations. The transistor branches 122 are coupled to the drain of a first PMOS transistor 140, and the transistor branches 130 are coupled to the drain of a second PMOS transistor 142. The PMOS transistors 140, 142 are biased ON by their gates being coupled to ground. The drains of the PMOS transistors 140, 142 constitute intermediate complimentary output clock signals CLK and CLK*.

The CLK and CLK* signals are coupled to a gain stage 150 that includes a pair of PMOS transistors 152, 154 biased ON by having their gates coupled to ground, and a pair of NMOS transistors 156, 158 biased ON by having their gates coupled to a supply voltage $V_{CC}$. The CLK signal is coupled to the gate of a first NMOS switching transistor 160, and the CLK* signal is coupled to the gate of a second NMOS switching transistor 162, which generates the $CLK_{OUT}$ signal at its drain. If desired a complimentary $CLK_{OUT}$ signal can be generated at the drain of the NMOS transistor 160.

Figure 11:
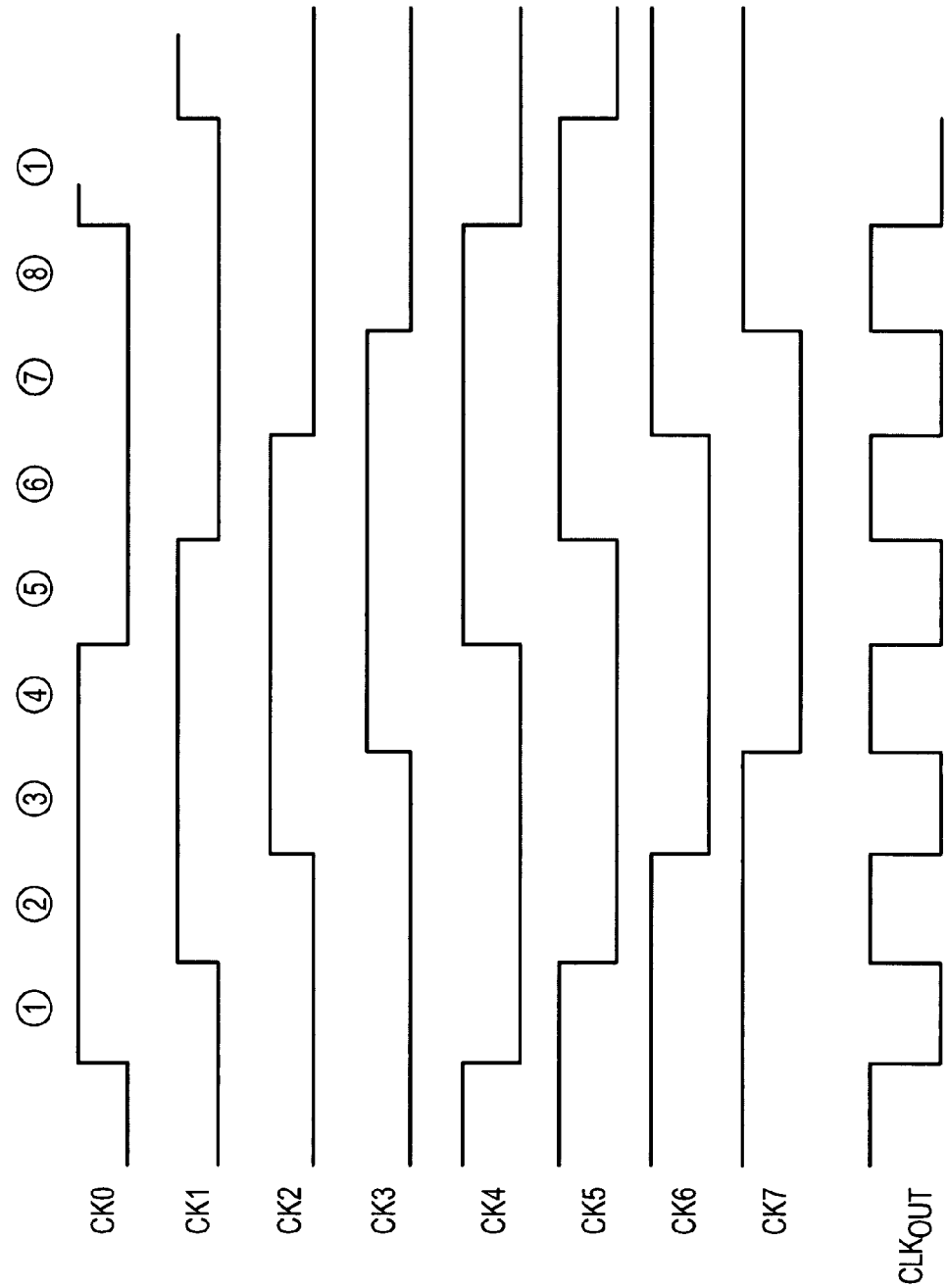
FIG. 11 is a timing diagram showing the signals applied to and generated by the clock serializer circuit of FIG. 10.

The operation of the clock serializer circuit 120 will now be explained with reference to the timing diagram of FIG. 11. The phases of the CK0-CK7 signals form 8 discrete time periods, which have been labeled as such in FIG. 11. The numbers of these time periods correspond to the numbers that have been used to label the transistor branches 122, 130 in FIG. 10. It can be seen that the transistors in each numbered branch are both ON during the correspondingly numbered time. For example, the transistors 124, 126 in the branch 122a are both ON during the time period "1" when the CK0 and CK5 signals are both high. Similarly, the transistors 132, 134 in the branch 130a are both ON during the time period "2" when the CK1 and CK6 signals are both high. As a result, the $CLK_{OUT}$ signal from the serializer circuit 110 toggles on every transition of any of the CK0-CK7 signals so that it has 4 times the frequency of the CK0-CK7 signals, as shown in FIG. 11.

Figure 12:
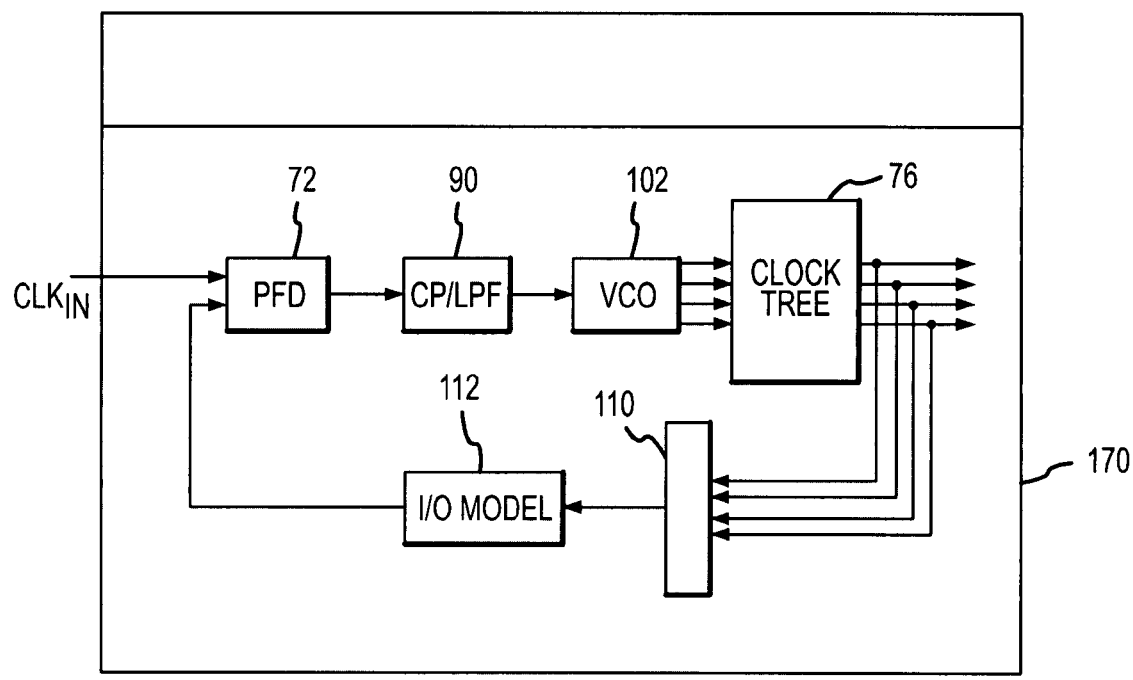
FIG. 12 is a block diagram of a phase-lock loop circuit according to still another embodiment of the invention.

Another embodiment of a phase-lock loop 170 according to the present invention is shown in FIG. 12. The phase-lock loop 170 uses many of the components used in the phase-lock loop 70 of FIG. 9 and, therefore, an explanation of their function and operation will not be repeated. The phase-lock loop 170 differs from the phase-lock loop 70 by coupling the 4 phased clock signals CK0-CK3 to the clock tree 76 where they can be used for various functions where a multi-phased clock signal is useful. For example, they can be used to coupled 4 bits of data to each of several data bus terminals. In either case, the CK0-Ck3 signals are coupled from the clock tree 76 to the serializer circuit 110, which generates a single CLK signal that is coupled to the I/O model circuit 112 and used as described above with reference to FIG. 9.

Figure 13:
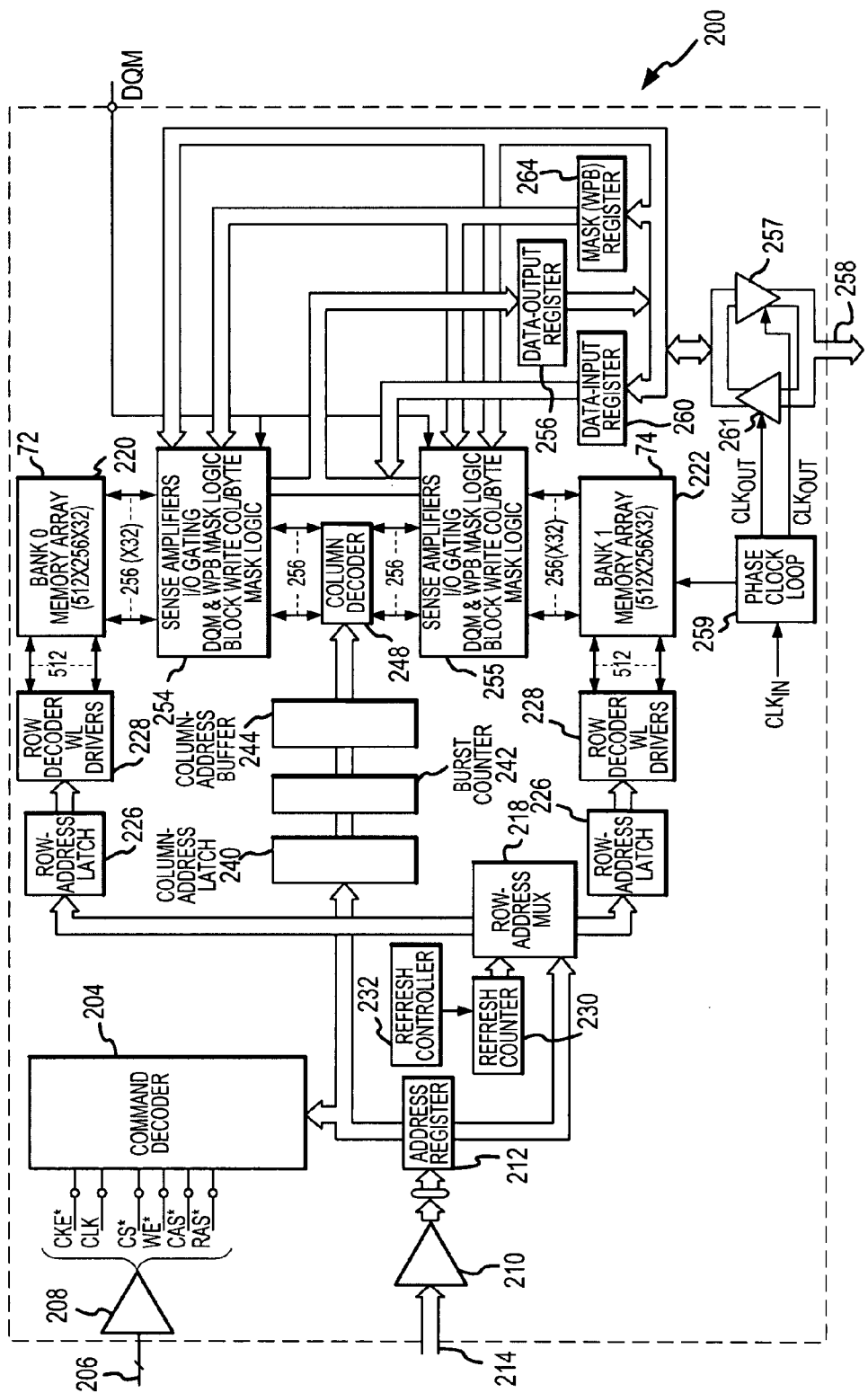
FIG. 13 is a block diagram of a memory device using phase-lock loops according to the present invention to generate write data and read data strobe signals for strobing data bits into and out of the memory device.

As mentioned above, the phase-lock loops of the present invention can be used to generate a read data strobe and a write data strobe in a memory device. With reference to FIG. 13, a synchronous dynamic random access memory ("SDRAM") 200 includes a command decoder that controls the operation of the SDRAM 200 responsive to high-level command signals received on a control bus 206 and coupled thorough input receivers 208. These high level command signals, which are typically generated by a memory controller (not shown in FIG. 13), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled through input receivers 210 and then applied to a memory controller (not shown in FIG. 14). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248.

Data to be read from one of the arrays 220, 222 is coupled to the column circuitry 254, 255 for one of the arrays 220, 222, respectively. The data is then coupled through a data output register 256 and data output drivers 257 to a data bus 258. The data output drivers 257 apply the read data to the data bus 258 responsive to a read data strobe generated by a phase-lock loop 259 in accordance with the present invention. The phase-lock loop 259 receives a periodic $CLK_{IN}$ signal and generates a $CLK_{OUT}$ signal, as explained above. The $CLK_{OUT}$ signal is used as a read data strobe so that the read data are coupled to the data bus 258 in substantially in phase with the $CLK_{IN}$ signal.

Data to be written to one of the arrays 220, 222 are coupled from the data bus 258 through data input receivers 260 to a data input register 261. The write data are coupled from the data bus 258 responsive to the $CLK_{OUT}$ signal, which is used as a write data strobe. As a result, the write data are coupled into the SDRAM 200 from the data bus 258 substantially in phase with the $CLK_{IN}$ signal. Alternatively, the phase-lock loop can be designed so that the phase detector used therein generates a minimum error signal when the $CLK_{FB}$ signal is the quadrature of the $CLK_{IN}$ signal using techniques that are well known to one skilled in the art so that the write data are coupled into the SDRAM 200 at the center of a "data eye" corresponding to the $CLK_{IN}$ signal. In either case, the write data are coupled to the column circuitry 254, 255 where they are transferred to one of the arrays 220, 222, respectively. A mask register 264 responds to a data mask DM signal to selectively alter the flow of data into and out of the column circuitry 254, 255, such as by selectively masking data to be read from the arrays 220, 222.

Figure 14:
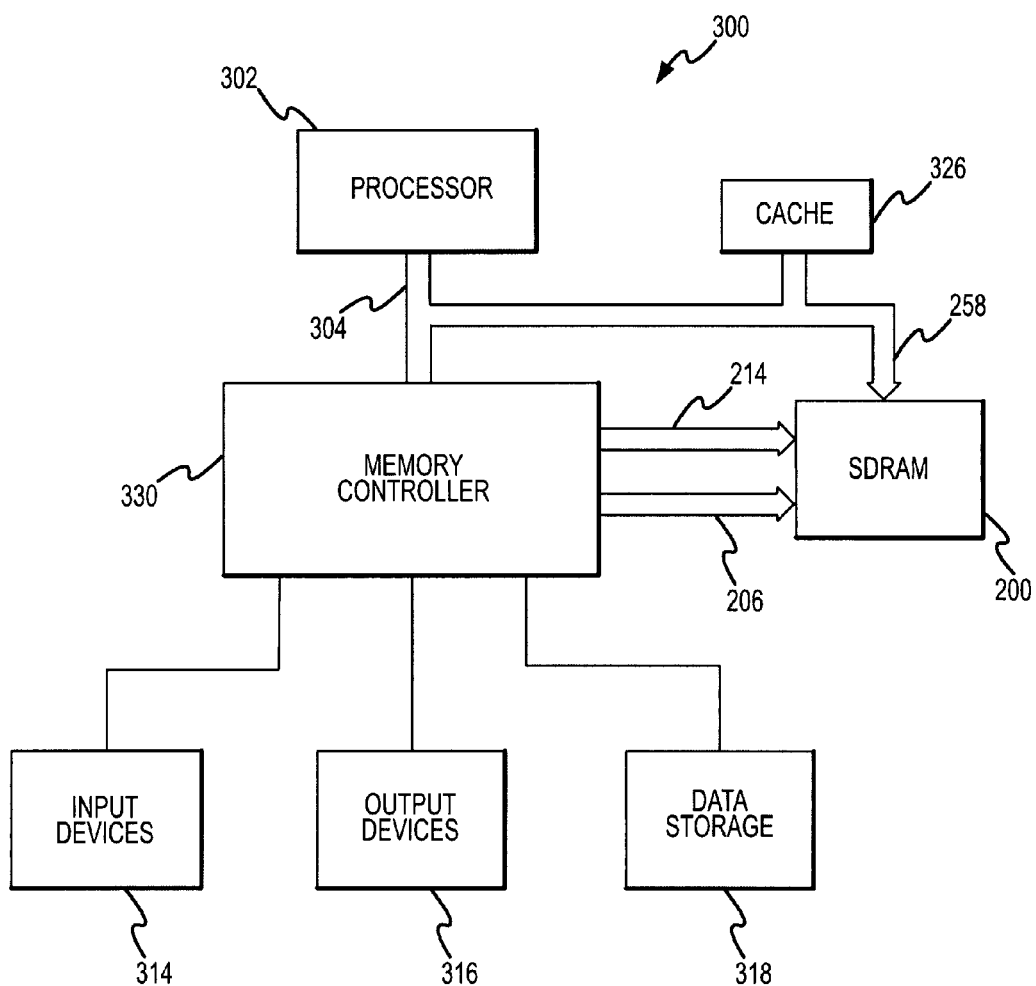
FIG. 14 is a block diagram of one embodiment of a computer system using the memory device of FIG. 13 or some other embodiment of a memory device in accordance with the invention.

FIG. 14 shows an embodiment of a computer system 300 that may use the SDRAM 200 or some other memory device that used one of the embodiments of a phase-lock loop described above or some other embodiment of the invention. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 518 are also typically coupled to the processor 302 to store data or retrieve data from external storage media (not shown). Examples of typical storage devices 318 include hard and floppy disks, tape cassettes, and compact disk read-only memories (CD-ROMs). The processor 302 is also typically coupled to a cache memory 326, which is usually static random access memory ("SRAM") and to the SDRAM 200 through a memory controller 330. The memory controller 330 includes an address bus coupled to the address bus 214 (FIG. 13) to couple row addresses and column addresses to the SDRAM 200. The memory controller 330 also includes a control bus that couples command signals to the control bus 206 of the SDRAM 200. The external data bus 258 of the SDRAM 200 is coupled to the data bus of the processor 302, either directly or through the memory controller 330.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A phase-lock loop generating an output clock signal responsive to an input clock signal, comprising:
  a phase detector having a first input receiving the input clock signal and a second input receiving the output clock signal, the phase detector generating a phase error signal at an output that is indicative of a relationship between the phase of the input clock signal and the phase of the output clock signal;
  a voltage controlled oscillator having an input coupled to the output of the phase detector and including a ring oscillator having a plurality of delay elements coupled to each other in a ring in an unstable relationship, each of the delay elements having a respective delay control terminal that controls the signal propagation delay through the delay element, the delay control terminal of each of the delay elements being coupled to the output of the phase detector so that the signal proportion delay of each of the delay elements corresponds to the phase error signal, each of the delay elements generating a respective phase of the clock signal generated by the voltage controlled oscillator, the voltage controlled oscillator operable to generate the clock signal at an output that has a frequency corresponding to the difference between the phase of the input clock signal and the phase of the output clock signal; and
  a frequency multiplier having an input coupled to receive the clock signal from the output of the voltage controlled oscillator and including a clock serializer coupled to receive each of the phases of the clock signal from the respective delay elements, the clock serializer operable to transition the output clock signal on each transition of any of the phases of the clock signal from the respective delay elements, the frequency multiplier operable to generate the output clock signal having a frequency that is an integer multiple of the frequency of the clock signal received from the output of the voltage controlled oscillator, the output of the frequency multiplier being coupled to the second input of the phase detector.

2. The phase-lock loop of claim 1, further comprising a loop filter coupled between the output of the phase detector and the input of the voltage controlled oscillator.

3. The phase-lock loop of claim 1, further comprising a loop amplifier coupled between the output of the phase detector and the input of the voltage controlled oscillator.

4. The phase-lock loop of claim 1, further comprising a clock tree coupled to receive the output clock signal from the frequency multiplier, the second input of the phase detector being coupled to the clock tree so that the second input of the phase detector receives the output clock signal from the frequency multiplier through the clock tree.

5. The phase-lock loop of claim 1 wherein the clock serializer comprises:
  a first plurality of transistor coupled in parallel with each other between a first output node and a first reference voltage, each of the transistors in the first plurality being coupled to alternating ones of the delay elements; and
  a second plurality of transistor coupled in parallel with each other between a second output node and a second reference voltage, each of the transistors in the second plurality being coupled to alternating ones of the delay elements to which the transistors in the first plurality are not connected.

6. The phase-lock loop of claim 1, further comprising a clock tree coupled to the voltage controlled oscillator to receive the phases of the clock signal generated by the respective delay elements.

7. The phase-lock loop of claim 6 wherein the frequency multiplier comprises a clock serializer coupled to the clock tree to receive each of the phases of the clock signal from the respective delay elements through the clock tree, the clock serializer being operable to transition the output clock signal on each transition of any of the phases of the clock signal from the respective delay elements.

8. The phase-lock loop of claim 1 wherein the phase detector comprises:
  an up/down control circuit that is operable to generate a down signal responsive to the output clock signal leading the input clock signal and an up clock signal responsive to output clock signal lagging the input clock signal; and
  a charge pump coupled to the up/down control circuit, the charge pump generating the error signal with a magnitude that causes a decrease in frequency of the output clock signal responsive to the down signal, the charge pump generating the error signal with a magnitude that causes an increase in frequency of the output clock signal responsive to the up signal.

9. The phase-lock loop of claim 8 wherein the up/down control circuit comprises:
- a first flip-flop having a clock input coupled to receive the output clock signal, the first flip-flop generating the down signal at an output, the first flip-flop having a first reset terminal;
- a second flip-flop having a clock input coupled to receive the input clock signal, the second flip-flop generating the up signal at an output, the second flip-flop having a second reset terminal; and
- a logic circuit having a first input coupled to the output of the first flip-flop, a second input coupled to the output of the second flip-flop, and an output coupled to the first and second reset terminals so that the up signal is generated only until the down signal is generated, and the down signal is generated only until the up signal is generated.

10. A phase-lock loop generating an output clock signal responsive to an input clock signal, comprising:
- a phase detector having a first input receiving the input clock signal and a second input receiving the output clock signal, the phase detector generating a phase error signal at an output that is indicative of a relationship between the phase of the input clock signal and the phase of the output clock signal;
- a voltage controlled oscillator having an input coupled to the output of the phase detector and including a ring oscillator having a plurality of delay elements coupled to each other in a ring in an unstable relationship, each of the delay elements having a respective delay control terminal that controls the signal propagation delay through the delay element, the delay control terminal of each of the delay elements being coupled to the output of the phase detector so that the signal proportion delay of each of the delay elements corresponds to the phase error signal, each of the delay elements generating a respective phase of the clock signal generated by the voltage controlled oscillator, the voltage controlled oscillator operable to generate the clock signal at an output that has a frequency corresponding to the difference between the phase of the input clock signal and the phase of the output clock signal;
- a clock tree coupled to the voltage controlled oscillator to receive the phases of the clock signal generated by the respective delay elements; and
- a frequency multiplier having an input coupled to receive the clock signal from the output of the voltage controlled oscillator and including a clock serializer coupled to the clock tree to receive each off the phases of the clock signal from the respective delay elements through the clock tree, the clock serializer being operable to transition the output clock signal on each transition of any of the phases of the clock signal from the respective delay elements, the frequency multiplier operable to generate the output clock signal having a frequency that is an integer multiple of the frequency of the clock signal received from the output of the voltage controlled oscillator, the output of the frequency multiplier being coupled to the second input of the phase detector.

11. The phase-lock loop of claim 10, further comprising a loop filter coupled between the output of the phase detector and the input of the voltage controlled oscillator.

12. The phase-lock loop of claim 10, further comprising a loop amplifier coupled between the output of the phase detector and the input of the voltage controlled oscillator.

13. The phase-lock loop of claim 10 wherein the phase detector comprises:
- an up/down control circuit that is operable to generate a down signal responsive to the output clock signal leading the input clock signal and an up clock signal responsive to output clock signal lagging the input clock signal; and
- a charge pump coupled to the up/down control circuit, the charge pump generating the error signal with a magnitude that causes a decrease in frequency of the output clock signal responsive to the down signal, the charge pump generating the error signal with a magnitude that causes an increase in frequency of the output clock signal responsive to the up signal.

14. A phase-lock loop generating an output clock signal responsive to an input clock signal, comprising:
- a phase detector having a first input receiving the input clock signal and a second input receiving the output clock signal, the phase detector generating a phase error signal at an output that is indicative of a relationship between the phase of the input clock signal and the phase of the output clock signal;
- a voltage controlled oscillator having an input coupled to the output of the phase detector and including a plurality of delay elements coupled to each other in a ring in an unstable relationship and operable to generate a respective phase of a clock signal, the voltage controlled oscillator operable to generate the clock signal at an output that has a frequency corresponding to the difference between the phase of the input clock signal and the phase of the output clock signal; and
- a frequency multiplier having an input coupled to receive the clock signal from the output of the voltage controlled oscillator, and including a clock serializer coupled to receive each of the phases of the clock signal from the respective delay elements, the clock serializer operable to transition the output clock signal on each transition of any of the phases of the clock signal from the respective delay elements, the frequency multiplier operable to generate the output clock signal having a frequency that is an integer multiple of the frequency of the clock signal received from the output of the voltage controlled oscillator, the output of the frequency multiplier being coupled to the second input of the phase detector.

15. The phase-lock loop of claim 14, further comprising a loop filter coupled between the output of the phase detector and the input of the voltage controlled oscillator.

16. The phase-lock loop of claim 14, further comprising a clock tree coupled to receive the output clock signal from the frequency multiplier, the second input of the phase detector being coupled to the clock tree so that the second input of the phase detector receives the output clock signal from the frequency multiplier through the clock tree.

17. The phase-lock loop of claim 14 wherein the phase detector comprises:
- an up/down control circuit that is operable to generate a down signal responsive to the output clock signal leading the input clock signal and an up clock signal responsive to output clock signal lagging the input clock signal; and
- a charge pump coupled to the up/down control circuit, the charge pump generating the error signal with a magnitude that causes a decrease in frequency of the output clock signal responsive to the down signal, the charge pump generating the error signal with a magnitude that causes an increase in frequency of the output clock signal responsive to the up signal.

* * * * *

UNITED STATES PATENT AND TRADEMARK OFFICE
CERTIFICATE OF CORRECTION

PATENT NO. : 7,391,243 B2 Page 1 of 1
APPLICATION NO. : 11/788133
DATED : June 24, 2008
INVENTOR(S) : Choi It is certified that error appears in the above-identified patent and that said Letters Patent is hereby corrected as shown below:

In column 11, line 49, in Claim 10, after "each" delete "off" and insert -- of --, therefor.

Signed and Sealed this

Second Day of September, 2008

JON W. DUDAS
*Director of the United States Patent and Trademark Office*